United States Patent
Hurwitz

(10) Patent No.: US 9,440,135 B2
(45) Date of Patent: Sep. 13, 2016

(54) MULTILAYER ELECTRONIC STRUCTURES WITH INTEGRAL VIAS EXTENDING IN IN-PLANE DIRECTION

(75) Inventor: Dror Hurwitz, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 212 days.

(21) Appl. No.: 13/482,045

(22) Filed: May 29, 2012

(65) Prior Publication Data

US 2013/0319736 A1     Dec. 5, 2013

(51) Int. Cl.
*H05K 1/11*      (2006.01)
*A63B 69/36*     (2006.01)
*A63B 69/00*     (2006.01)

(52) U.S. Cl.
CPC ....... *A63B 69/3685* (2013.01); *A63B 69/0059* (2013.01); *A63B 69/36* (2013.01); *A63B 69/3608* (2013.01); *A63B 69/3676* (2013.01); *A63B 2208/0204* (2013.01)

(58) Field of Classification Search
CPC .............. H01L 21/4846; H01L 23/49822; H01L 2924/0002; H01L 2924/00
USPC .............. 174/257, 264, 261, 262; 438/624; 257/E23
See application file for complete search history.

(56) References Cited

U.S. PATENT DOCUMENTS

| | | | |
|---|---|---|---|
| 5,936,298 A * | 8/1999 | Capocelli et al. | 257/531 |
| 6,946,692 B1 | 9/2005 | Hsu | |
| 7,635,641 B2 | 12/2009 | Hurwitz et al. | |
| 7,669,320 B2 | 3/2010 | Hurwitz et al. | |
| 7,682,972 B2 | 3/2010 | Hurwitz et al. | |
| 2004/0227227 A1* | 11/2004 | Imanaka et al. | 257/700 |
| 2005/0046001 A1* | 3/2005 | Warner | 257/678 |
| 2005/0098886 A1* | 5/2005 | Pendse | 257/738 |
| 2007/0289127 A1* | 12/2007 | Hurwitz et al. | 29/827 |
| 2007/0298604 A1* | 12/2007 | Liu et al. | 438/624 |
| 2009/0073667 A1* | 3/2009 | Chung et al. | 361/763 |
| 2012/0181508 A1* | 7/2012 | Chang et al. | 257/29 |
| 2014/0020945 A1* | 1/2014 | Hurwitz et al. | 174/262 |

FOREIGN PATENT DOCUMENTS

KR     1020060079428 A     7/2006

* cited by examiner

*Primary Examiner* — Yuriy Semenenko
(74) *Attorney, Agent, or Firm* — Wiggin and Dana LLP; Gregory S. Rosenblatt; Jonathan Daniel Hall

(57) ABSTRACT

A multilayer electronic support structure comprising at least one pair of adjacent feature layers extending in an X-Y plane that are separated by a via layer; said via layer comprising a dielectric material that is sandwiched between the two adjacent feature layers and at least one one non-cylindrical via post that couples said pair of adjacent feature layers through the dielectric material in a Z direction perpendicular to the X-Y plane; wherein said at least one non-cylindrical via post is characterized by having a long dimension in the X-Y plane that is at least 3 times as long as a short dimension in the X-Y plane.

25 Claims, 4 Drawing Sheets

MULTILAYER ELECTRONIC STRUCTURES WITH INTEGRAL VIAS EXTENDING IN IN-PLANE DIRECTION

BACKGROUND

1. Field of the Invention

The present invention relates to multilayer electronic support structures such as interposers, and to methods of manufacturing of same.

2. Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough sides walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may create additional stray inductances.

The filling process of the drilled via holes is usually achieved by copper electroplating. The electroplating deposition technique may result in dimpling, where a small crater appears at the top of the via. Alternatively, overfill may result, where a via channel is filled with more copper than it can hold, and a domed upper surface that protrudes over the surrounding material is created. Both dimpling and overfill tend to create difficulties when subsequently stacking vias one on top of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

Although the range of acceptable sizes and reliability is improving over time, the disadvantages described hereinabove are intrinsic to the drill & fill technology and are limit the effective range of fabricable via sizes. It will further be noted that laser drilling is best for creating round via channels. Although slot shaped via channels may be fabricated by laser milling, nevertheless, the range of drill & fill via geometries that may effectively be fabricated is somewhat limited. Fabrication of vias by drill & fill is expensive and it is difficult to evenly and consistently fill the via channels created thereby with copper using the relatively, cost-effective electroplating process.

Laser drilled vias in composite dielectric materials are practically limited to $60 \times 10^{-6}$ m diameter, and even so suffer from significant tapering shape as well as rough side walls due to the nature of the composite material drilled, in consequence of the ablation process involved.

In addition to the other limitations of laser drilling as described hereinabove, there is a further limitation of the drill & fill technology in that it is difficult to create different diameter vias in the same layer, since when different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition rates for different sized vias.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover and subsequently exposed to create a pattern which is selectively removed to make trenches that expose the seed layer. Via posts are created by depositing Copper into the trenches in the photo-resist. The remaining photo-resist is then removed, the seed layer is etched away, and a dielectric material that is typically a polymer impregnated glass fiber mat, is laminated thereover and therearound to encase the vias posts. Various techniques and processes can be then use to thin down the dielectric material, planarizing it and exposing the tops of the via posts allowing conductive connection to a ground or reference plane thereby, for building up the next metal layer thereupon. Subsequent layers of metal conductors and via posts may be deposited thereonto, by repeating the process to build up a desired multilayer structure.

In an alternative but closely linked technology, known hereinafter as 'panel plating', a continuous layer of metal or alloy is deposited onto a substrate. A layer of photo-resist is deposited on top of this and a pattern is developed therein, and the pattern of developed photo-resist is stripped away, selectively exposing the metal thereunder, which may then be etched away. The undeveloped photo-resist protects the underlying metal from being etched away, and leaves a pattern of upstanding features and vias. After stripping away the undeveloped photo-resist, a dielectric material, such as a polymer impregnated glass fiber mat, may be laminated around and over the upstanding copper features and/or via posts.

The via layers created by pattern plating or panel plating methodologies such as those described above, are typically known as 'via posts' and feature layers from copper.

It will be appreciated that the general thrust of the microelectronic evolution is directed towards fabricating ever smaller, thinner and lighter and more powerful products having high reliability. Unfortunately, the use of thick, cored interconnects, prevents ultra-thin products being attainable. To create ever higher densities of structures in the interconnect IC substrate or interposer, ever more layers of ever smaller connections are required. Indeed, sometimes it is desirable to stack components on top of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper, and the dielectric may be a fiber reinforced polymer. Typically, a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd. For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures. The method includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

BRIEF SUMMARY

A first aspect of the invention is directed to a multilayer electronic support structure comprising at least one pair of adjacent feature layers extending in an X-Y plane that are separated by a via layer; said via layer comprising a dielectric material that is sandwiched between the two adjacent feature layers and further comprising at least one non-cylindrical via post that couples said pair of adjacent feature layers through the dielectric material, in a Z direction perpendicular to the X-Y plane; wherein said at least one non-cylindrical via post is characterized by having a long dimension in the X-Y plane that is at least 3 times as long as a short dimension in the X-Y plane.

In some embodiments, the at least one non-cylindrical via post extends linearly within the X-Y plane and enables conductive coupling between elements in adjacent planes of the support structure but with different positions in the X-Y plane.

In some embodiments, the at least one non-cylindrical via post is coupled to a feature in a lower layer at a first end.

In some embodiments, the at least one non-cylindrical via post is coupled to a feature in a higher layer at a second end.

In some embodiments, the multilayer electronic support structure comprises alternate layers of conductive vias and conductive features encapsulated by a dielectric material, wherein a pair of conductive vias extends in the X-Y plane, enabling conductive coupling between features having different positions in the X-Y plane.

Optionally, the pair of conductive layers acts has a significant inductance and acts as an inductor.

In some embodiments, the at least one conductive component extends linearly within the X-Y plane by at least 500 microns.

In some embodiments, the at least one conductive component extends linearly within the X-Y plane by several millimeters.

In some embodiments, the at least one conductive component has a Z dimension of at least 30 microns.

In some embodiments, the at least one conductive component has a Z dimension of at least 40 microns.

In some embodiments, the at least one conductive component has a Z dimension of at least 50 microns.

In some embodiments, the at least one conductive component has a width perpendicular to the Z dimension and to the linear extension of less than 50 microns.

In some embodiments, the at least one component in the via layer comprises a seed layer covered by a metal layer deposited thereover by electroplating.

In some embodiments, the seed layer comprises copper.

In some embodiments, the seed layer further comprises an underlying adhesive metal layer laid down to promote adhesion to the dielectric.

In some embodiments, the adhesive metal layer comprises at least one of the group comprising titanium, chromium, tantalum and tungsten.

In some embodiments, the metal layer comprises copper.

Optionally, wherein the metal layer is covered with a further metal seed layer.

In some embodiments, the at least one component in the via layer is a square component, extending in two perpendicular directions in the X-Y plane, and where the corners of the square have a radius of curvature of less than 3 microns.

In some embodiments, the at least one component in the via layer is a strip component having one dimension in the X-Y plane that is at least three times a perpendicular dimension in the X-Y plane.

In some embodiments, the at least one component in the via layer is a strip component that extends at least one millimeter.

In some embodiments, the at least one component in the via layer is a strip component that extends several millimeters.

In one fabrication process, a feature layer followed by a via layer comprising at least one non-cylindrical via post is fabricated by a process comprising the steps of: (a) obtaining a substrate including an upper via layer in dielectric having an upper surface that is treated to expose ends of vias in upper via layer; (b) covering the upper surface with a seed layer; (c) applying a layer of photo-resist over the seed layer; (d) exposing and selectively removing the exposed photo-resist to form a negative pattern of features; (e) depositing metal into the negative pattern to fabricate a feature layer; (f) stripping away the photo-resist, leaving feature layer upstanding; (g) applying a second, deeper layer of photoresist over the feature layer; (h) exposing and developing a pattern of vias in the second layer of photoresist including at least one non-cylindrical via post having a long dimension in the X-Y plane that is at least 3 times as long as a short dimension in the X-Y plane; (i) electroplating copper into the second pattern, and (j) stripping away the second layer of photoresist. (k) removing the exposed seed layer, and (l) laminating a dielectric material over the at least one non-cylindrical via post having a long dimension in the X-Y plane that is at least 3 times as long as a short dimension in the X-Y plane.

Optionally the process is further characterized by at least one of the following:
(i) the seed layer comprises copper; (ii) the metal layer comprises copper;
(iii) the dielectric material comprises a polymer, and (iv) the dielectric material comprises ceramic or glass reinforcements.

Optionally the process is further characterized by at least one of the following: (i) the dielectric layer comprises a polymer selected from the group comprising polyimide, epoxy, Bismaleimide, Triazine and blends thereof; (ii) the dielectric layer comprises glass fibers, and (iii) the dielectric layer comprises particle fillers.

The process may comprise the further step of: (m) thinning to expose the metal.

The process may comprise the further step of: (n) depositing a metal seed layer over the thinned surface.

In an alternative process, the at least one via layer is fabricated by a process comprising the steps of: (i) obtaining a substrate including a feature layer and having exposed copper; (ii) covering the feature layer with a seed layer; (iii) depositing a metal layer over the seed layer; (iv) depositing a layer of photo-resist over the metal layer; (v) exposing a positive pattern of vias in the photoresist; (vi) etching away the metal layer exposed; (vii) stripping away the photo-resist, leaving the at least one component in the via layer upstanding, and (viii) laminating a dielectric material over the at least one component in the via layer.

Optionally, at least one of the following limitations applies: (a) the seed layer comprises copper; (b) the metal layer comprises copper; (c) the dielectric material comprises a polymer; (d) the dielectric material further comprises ceramic or glass reinforcements.

Optionally, at least one of the following limitations applies: (e) The dielectric material comprises a polymer selected from the group comprising polyimide, epoxy, Bismaleimide, Triazine and blends thereof; (f) the dielectric material comprises a polymer reinforced with glass fibers, and (g) the dielectric material comprises a polymer and inorganic particle fillers.

The method may comprise the further step (ix) of thinning to expose the metal.

The method may comprise the further step (x) of depositing a metal seed layer over the ground surface.

The term microns or μm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

Like reference numbers and designations in the various drawings indicated like elements.

DETAILED DESCRIPTION

In the description hereinbelow, support structures consisting of metal vias in a dielectric matrix, particularly, copper via posts in a polymer matrix, such as polyimide or epox-y or BT (Bismaleimide/Triazine) or their blends, reinforced with glass fibers are considered.

It is a feature of Access' photo-resist and pattern or panel plating and laminating technology, as described in U.S. Pat. No. 7,682,972, U.S. Pat. No. 7,669,320 and U.S. Pat. No.

7,635,641 to Hurwitz et al., incorporated herein by reference, that there is no effective upper limit to the in-plane dimensions of a feature.

Figure 1:
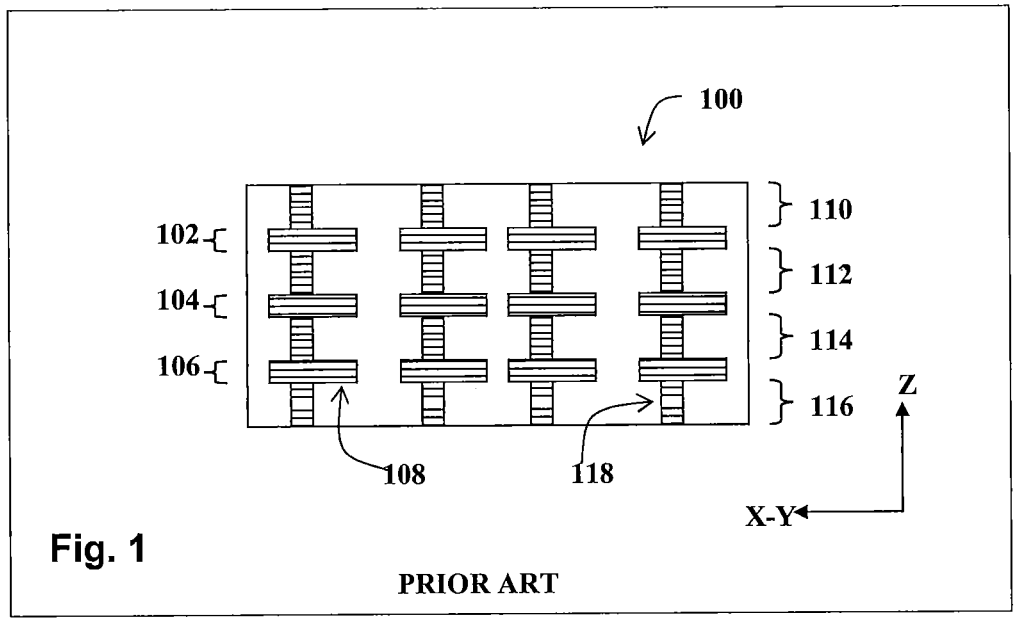
FIG. 1 is a simplified section through a multilayer composite support structure of the prior art.

FIG. 1 is a simplified section through a multilayer composite support structure of the prior art. As described in U.S. Pat. No. 7,682,972, U.S. Pat. No. 7,669,320 and U.S. Pat. No. 7,635,641, for example, multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between features 108 in the adjacent functional or feature layers 102, 104, 106. Thus the feature layers 102, 104, 106 include features 108 generally laid out within the layer, in the X-Y plane, and vias 118 that conduct current across the dielectric layers 110, 112, 114, 116. Vias 118 are generally designed to have minimal inductance and are sufficiently separated to have minimum capacitances therebetween.

When fabricated by drill and fill, the vias are typically cylindrical, since drill holes are typically cylindrical. For conformity to expected norms, via posts created by electroplating have, until now, also been typically cylindrical.

Figure 2:
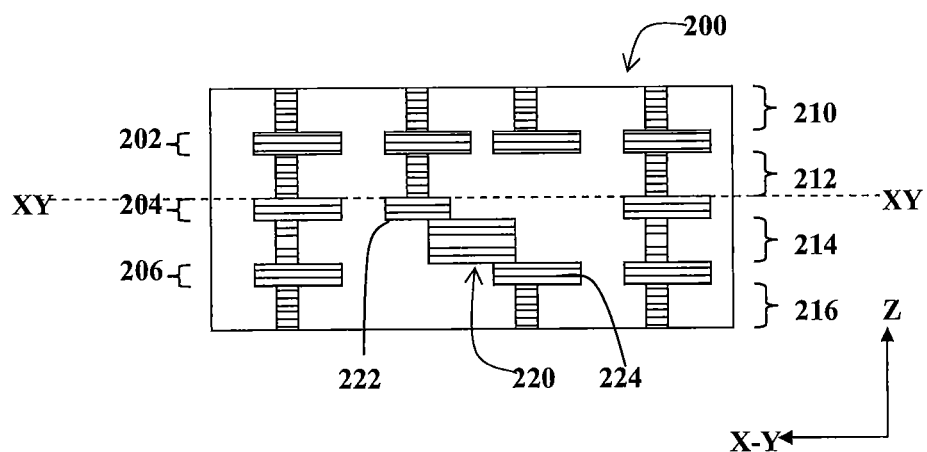
FIG. 2 is a simplified section through a multilayer composite support structure of the present invention, wherein the via layer includes components that extend in the X-Y plane and connect elements having different positions in the X-Y direction.
Figure 2A:
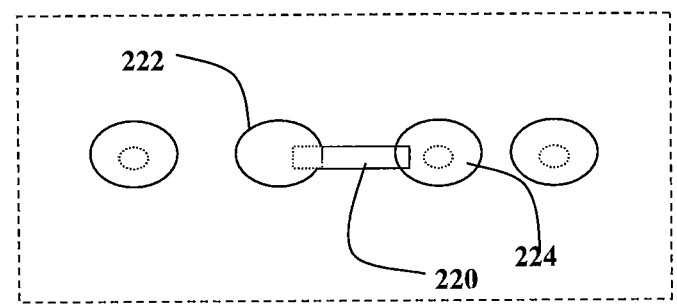
FIG. 2A is a plan view of the structure of FIG. 2, showing how via 220 couples feature 224 in a first lower feature layer with feature 222 in a second, higher feature layer, where features 222 and 224 are not in vertical alignment, i.e. there is not only displacement perpendicular to the XY plane, but also within the X-Y plane.

With reference now to FIG. 2, a section through a simplified multilayer electronic support structure 200 of an embodiment is shown. Once again, multilayer electronic support structure 200 consists of feature layers separated by dielectric layers 210, 212, 214, 216 including vias, mutatis mutandis, however, in contradistinction to the prior art, a via layer 214 may include a component 220 that extends in the X-Y plane and connects elements 222, 224 having different positions in the X-Y direction. As shown in top planar view, in the X-Y plane, in FIG. 6, the component 220 has a long dimension, y, which is at least 3 times as long as the short dimension, y.

It will be appreciated that having a component 220 in a via layer 214 of a multilayer support structure 200 that does not merely provide Z direction coupling but also extends in the X-Y plane, is contrary to the accepted concepts of multilayer circuit design.

Figure 3:
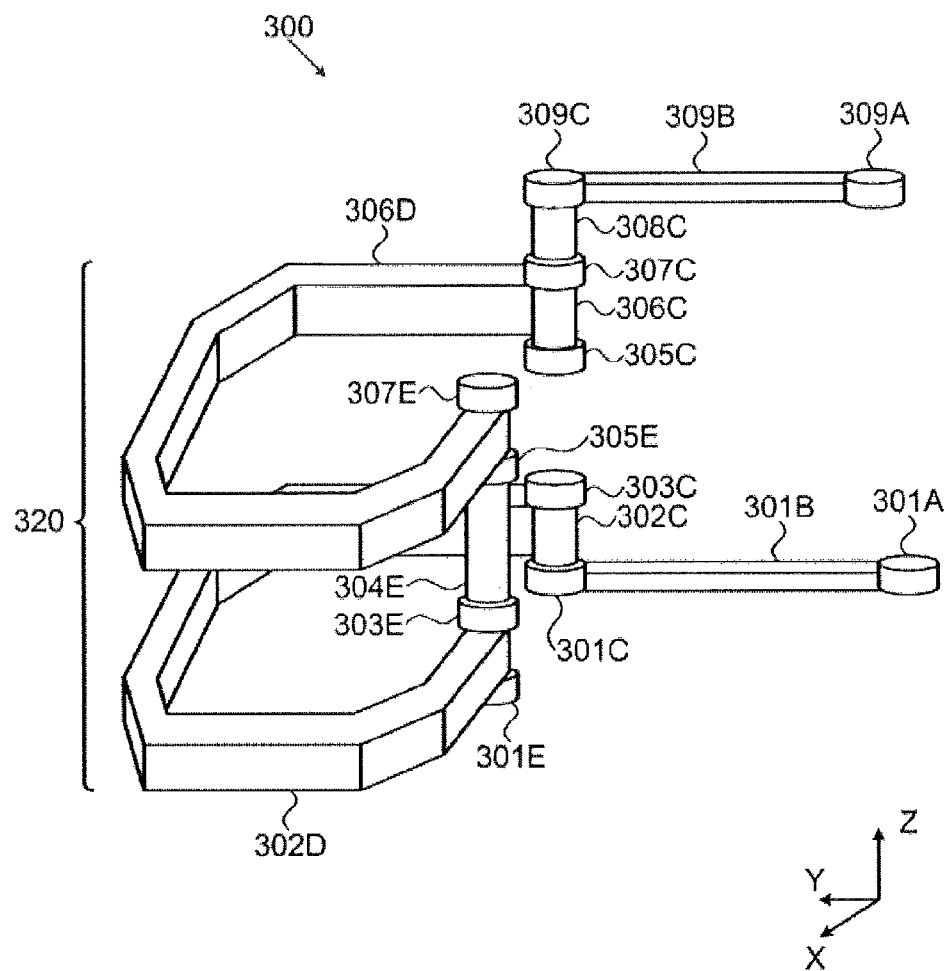
FIG. 3 shows a pair of conductor vias that may serve, for example, as an inductor, and that may be incorporated within an interconnect structure.

An example of a via conductor structure as described hereabove, and fabricated using the via-post approach developed by AMITEC, is shown in FIG. 3. With reference to FIG. 3, an isometric projection of copper vias and layers are shown. It will be appreciated that when fabricated by the via post technology, the copper structure 300 of FIG. 3 is surrounded with a dielectric (not shown) and incorporated in a substrate (not shown). The structure 300 (and the surrounding substrate) contains five X-Y plane conductive metal pad layers with features labeled 301A, 301B, 301C, 301E, 303C, 303E, 305C, 305E, 307C, 309A, 309B and 309C, that are interconnected in the Z axis with four via post layers 302C, 302D, 304E, 306C, 306D and 308C, elements with the same letter being vertically aligned. While two of the via post layers 304E, 308C shown are simple via layers for providing Z axis interconnections as described at length in U.S. Pat. No. 7,682,972, U.S. Pat. No. 7,669,320 and U.S. Pat. No. 7,635,641 to Hurwitz et al., the vias 302D, 306D extend in the x-y plane and provide in plane "via conductors" that have fairly large cross section dimensions when compared to the conductive metal pad layers 301A, 301B, 301C, 301E, 303C, 303E, 305C, 305E, 307C, 307E, 309A, 309B and 309C and consequently can carry relatively higher current densities at lower electrical resistance and at lower thermal impedances than the conductive metal pad layers 301A, 301B, 301C, 301E, 303C, 303E, 305C, 305E, 307C, 307E, 309A, 309B and 309C. As these extensive via conductors 302D, 306D are extensive, closely aligned conductors, when combined, they provide an inductor pair. The metal pad layers may include extensive connectors 301B, 309B extending in the X-Y plane, perhaps connecting vias in different positions as well.

As will be appreciated by persons of the art, once via posts do not only provide through thickness connections in the z direction, but also serve as in plane connections in the x-y plane, various combinations of 'conductor vias' may be formed for multiple electrical purposes. For example, as shown in FIG. 3, vias 302D, 306D may be low loss, high Q, inductors, and in this manner, an inductive via pair structure 320 may be fabricated.

It will be appreciated that using electroplating techniques, via posts may have substantially any size and shape, and may, for example be square. Thus at least one component in the via layer is a square component, extending in two perpendicular directions in the X-Y plane. By electroplating, fairly tight corners are possible, and the corners of a square or rectangular via posts may be fabricated with a radius of curvature of less than 3 microns. This cannot be achieved with drill & fill techniques. In practice, however, sharp corners of metal inclusions are generally avoided as they may serve as stress concentrators.

As described hereinabove, embodiments may be directed to multilayer electronic support structure comprising at least one pair of adjacent feature layers extending in an X-Y plane that are separated by a via layer; the via layer comprising a dielectric material that is sandwiched between the two adjacent feature layers and at least one non-cylindrical via post that couples the pair of adjacent feature layers in a Z direction perpendicular to the X-Y plane; wherein the at least one non-cylindrical via post is characterized by having a long dimension in the X-Y plane that is at least 3 times as long as a short dimension in the X-Y plane. The via layer will typically include regular substantially cylindrical via posts as well.

Figure 4:
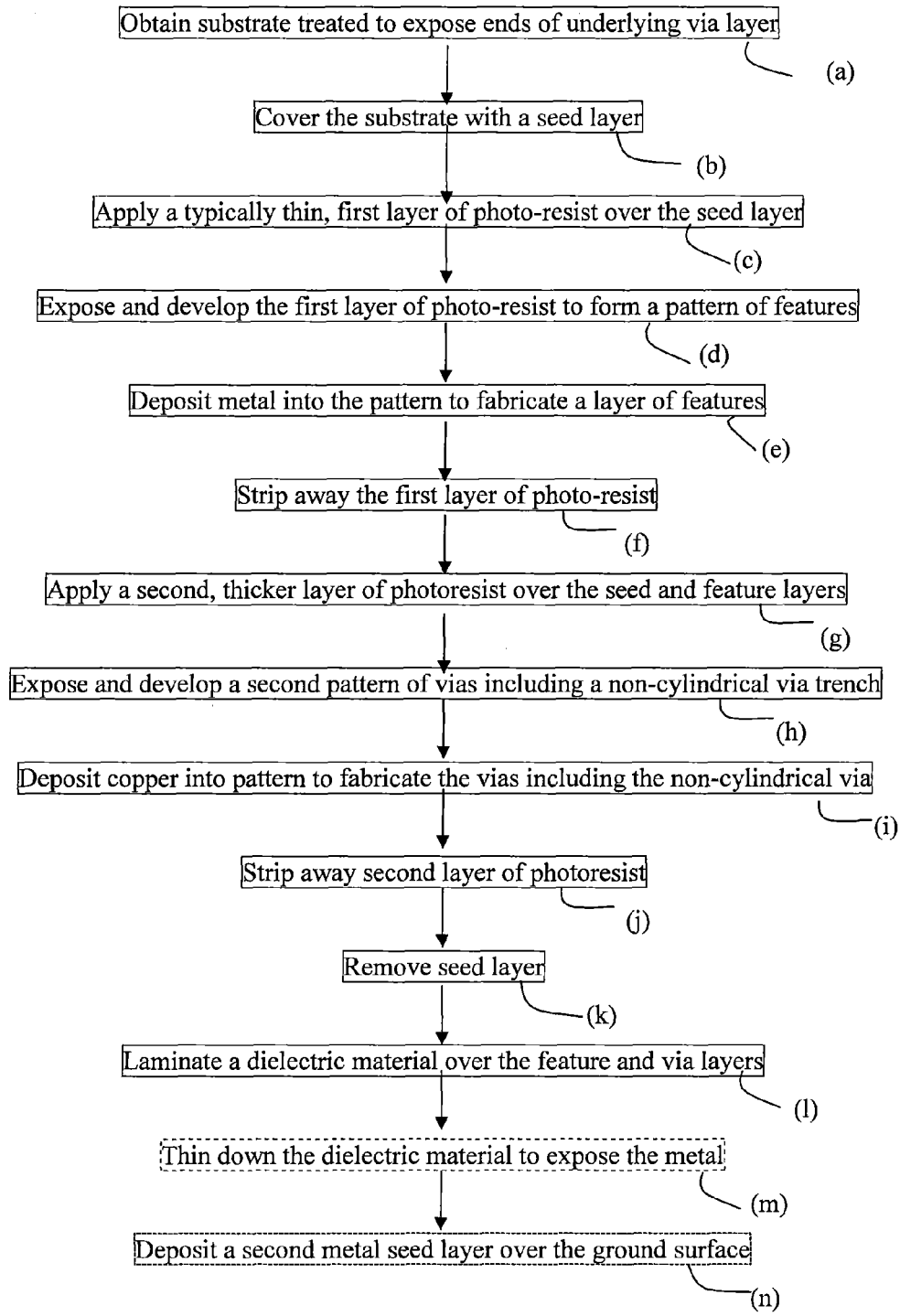
FIG. 4 is one flowchart showing how the structures described herein may be fabricated.
Figure 5:
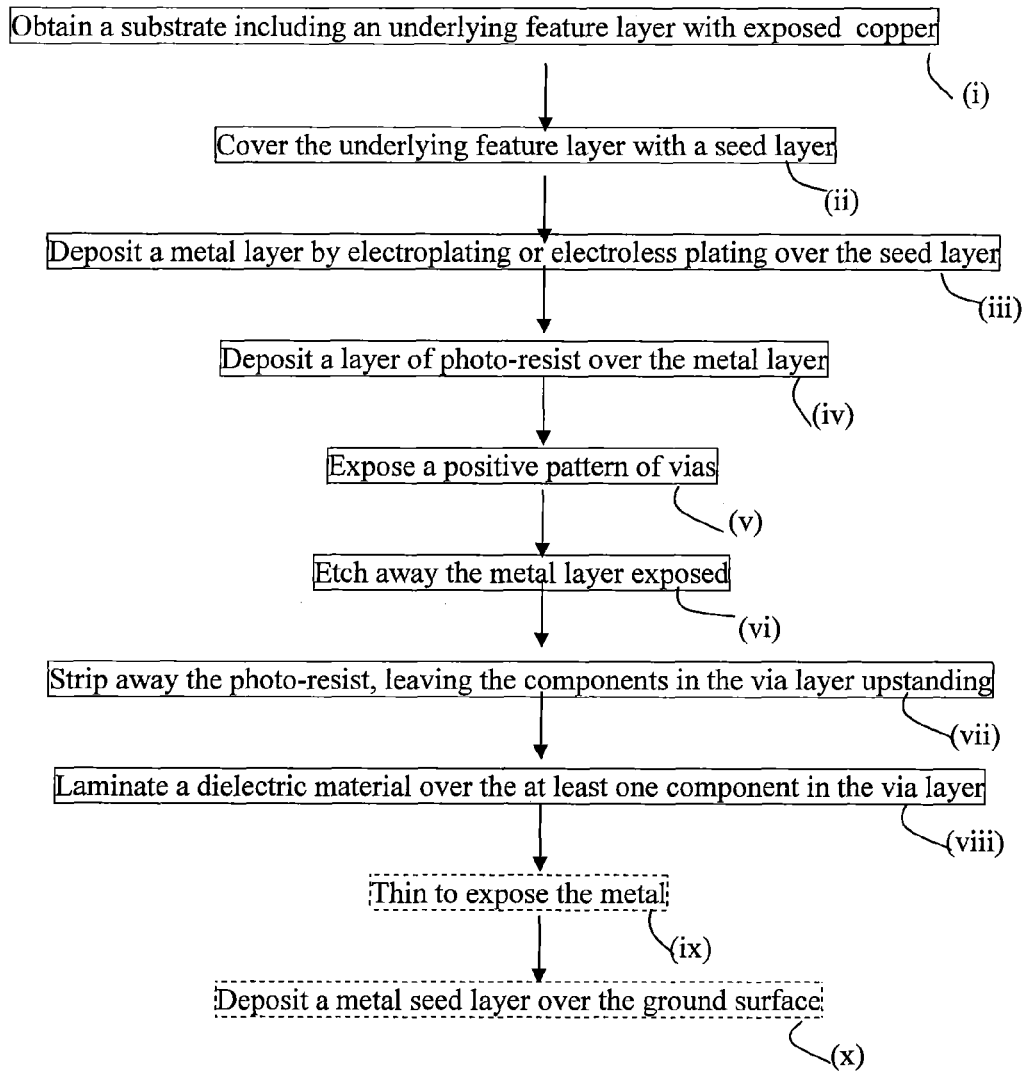
FIG. 5 is a second flowchart showing how structures described herein may be fabricated.

With reference to FIG. 4, in some embodiments, a feature layer followed by a via layer including at least one non-cylindrical via post having a long dimension in the X-Y plane that is at least 3 times as long as a short dimension in the X-Y plane may be fabricated by the steps of: obtaining a substrate including an upper via layer in dielectric surround that is polished, thinned, planarized or otherwise treated to expose the copper thereof—step (a). The substrate with the exposed ends of the vias is covered with a seed layer that is typically copper—step (b). The seed layer is typically about 0.5 microns-1.5 microns thick and may be deposited by sputtering or by electroless plating, for example.

To aid adhesion, the seed layer may includes a first thin adhesion metal layer that may be fabricated from titanium, chrome or nickel-chrome, for example, and will typically have a thickness in the range of 0.04 microns to 0.1 microns. A layer of photo-resist is then deposited over the seed layer—step (c), and exposed to form a negative pattern of features—step (d). A metal, typically copper is deposited into the metal pattern, by electroplating or electroless plating—step (e) to fabricate a feature layer. The photo-resist layer is removed to leave the upstanding feature layer—step (f). Next, a second, deeper layer of photoresist is deposited over the seed layer and upstanding feature layer—step (g) and a pattern of vias posts including at least one trench having a long dimension in the X-Y plane that is at least 3 times as long as a short dimension in the X-Y plane is developed in the second deeper layer of photoresist—step (h). Copper is electroplated or electroless plated into the pattern in the second, deeper layer of photoresist to fabricate via posts and at least one non-cylindrical via post having a long dimension in the X-Y plane that is at least 3 times as long as a short dimension in the X-Y plane—step (i). The second layer of photoresist is now stripped away, leaving the via posts and the non-cylindrical via post having a long dimension in the X-Y plane that is at least 3 times as long as a short dimension in the X-Y plane upstanding—step (j). The seed layer is now removed—step (k) by exposing the structure to a wet etch of ammonium hydroxide or copper chloride, for example, and a layer of dielectric is now laminated over both the feature layer and the via layer—step (l). The dielectric material may then be thinned down—step (m) to expose the metal, by mechanical, chemical or chemical-mechanical grinding or polishing which also planarizes the top surface, and then a second metal seed layer may be depositing over the thinned surface—step (n).

The dielectric material may comprise a polymer, such as polyimide, epoxy, Bismaleimide, Triazine and blends thereof, which may include inorganic reinforcements, and typically includes glass fibers and ceramic particles. Indeed, the dielectric material is typically fabricated from a woven fiber prepreg impregnated with the polymer resin that includes ceramic particulate filler.

It will be appreciated that in addition to pattern plating described in FIG. 4, in an alternative method, the at least one via layer is fabricated by the steps of: obtaining a substrate including an underlying feature layer with exposed copper—step (i). The underlying feature layer is covered with a seed layer—step (ii), typically copper. A metal layer, typically copper, is deposited, typically by electroplating or electroless plating over the seed layer—step (iii). A layer of photo-resist is depositing over the metal layer—step (iv) and a positive pattern of vias is developed—step (v). The metal layer exposed is etched away—step (vi). Where fabricated in copper, a wet copper etchant, such as ammonium hydroxide or copper chloride, may be used. The remaining photo-resist is stripped away—step (vii), leaving the at least one component in the via layer upstanding, and a dielectric material is laminated over the at least one component in the via layer—step (viii). To build up further layers, the dielectric may be thinned to expose the metal—step (ix) and then a metal seed layer may be deposited over the ground surface—step (x).

Persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A multilayer electronic support structure comprising at least a first feature layer extending in an X-Y plane and a second feature layer extending in an X-Y plane that is parallel to the first feature layer, said first and second feature layers being separated by a via layer; said feature layers comprising metal features surrounded by a dielectric material comprising a polymer matrix and said via layer comprising metal vias surrounded by the dielectric material wherein at least one non-cylindrical via post in the via layer conductively couples a first feature in the first feature layer with a second feature in the second feature layer, such that the first feature and the second feature are not in alignment in a Z direction perpendicular to the X-Y plane and do not overlap; wherein said at least one non-cylindrical via post is characterized by having a long dimension in the X-Y plane that is at least 3 times as long as a short dimension in the X-Y plane.

2. The multilayer electronic support structure of claim 1 comprising alternate layers of conductive vias and conductive features encapsulated by laminating in a dielectric, wherein a pair of conductive vias extend in the X-Y plane and enable conductive coupling between features having different positions in the X-Y plane.

3. The multilayer electronic support structure of claim 2 wherein the pair of conductive vias comprises an inductor.

4. The multilayer electronic support structure of claim 1, wherein the at least non-cylindrical via post extending linearly within the X-Y plane by at least 500 microns.

5. The multilayer electronic support structure of claim 1, wherein the at least one non-cylindrical via post extending linearly within the X-Y plane by several millimeters.

6. The multilayer electronic support structure of claim 1, wherein the at least one non-cylindrical via post extending linearly within the X-Y plane has a Z dimension of at least 30 microns.

7. The multilayer electronic support structure of claim 1, wherein the at least one non-cylindrical via post extending linearly within the X-Y plane has a Z dimension of at least 40 microns.

8. The multilayer electronic support structure of claim 1, wherein the at least one non-cylindrical via post extending linearly within the X-Y plane has a Z dimension of at least 50 microns.

9. The multilayer electronic support structure of claim 1, wherein the at least one non-cylindrical via post extending linearly within the X-Y plane has a width perpendicular to the Z dimension and to the linear extension of less than 50 microns.

10. The multilayer electronic support structure of claim 1, wherein the at least one non-cylindrical via post in the via layer comprises a seed layer covered by a metal layer deposited thereover by electroplating.

11. The multilayer electronic support structure of claim 10, wherein the seed layer comprises copper.

12. The multilayer electronic support structure of claim 10, wherein the at least one non-cylindrical via post comprises copper.

13. The multilayer electronic support structure of claim 10, wherein the at least one non-cylindrical via post is covered with a further metal seed layer.

14. The multilayer electronic support structure of claim 10, wherein the seed layer further comprises a first deposited adhesive metal layer comprising at least one of the group comprising titanium, chromium, tantalum and tungsten.

15. The multilayer electronic support structure of claim 1, wherein the at least one non-cylindrical via post in the via layer is a strip component having one dimension in the X-Y plane that is at least three times a perpendicular dimension in the X-Y plane.

16. The multilayer electronic support structure of claim 1, wherein the at least one non-cylindrical via post in the via layer is a strip component that extends at least one millimeter.

17. The multilayer electronic support structure of claim 1, wherein the at least one non-cylindrical via post in the via layer is a strip component that extends several millimeters.

18. The multilayer electronic support structure of claim 1, wherein the at least one via layer is fabricated by a process comprising the steps of:
- (a) obtaining a substrate including an underlying via layer that is treated to expose ends of vias in the underlying via layer;
- (b) covering the substrate with a seed layer;
- (c) depositing a layer of photo-resist over the seed layer;
- (d) exposing and developing the photo-resist to form a negative pattern of features;
- (e) depositing metal into the negative pattern to fabricate the first layer of features;
- (f) stripping away photo-resist, leaving the first layer of features upstanding;
- (g) applying a second layer of photoresist over the seed layer and the first layer of features;
- (h) exposing and developing a pattern of vias including the at least one non-cylindrical via post having a long dimension in the X-Y plane that is at least 3 times as long as a short dimension in the X-Y plane in the second layer of photoresist;
- (i) electroplating copper into the second pattern;
- (j) stripping away the second layer of photoresist;
- (k) removing the seed layer;
- (l) laminating a dielectric material over the at least one non-cylindrical via post in the via layer;
- (m) thinning the dielectric material to expose the metal of the at least one non-cylindrical via post;
- (n) depositing a metal seed layer over the thinned dielectric material with the exposed metal non-cylindrical via post; and
- (o) fabricating a second layer of features.

19. The multilayer electronic support structure of claim 18, further characterized by at least one of:
- (i) the seed layer comprises copper;
- (ii) the metal via layer comprises copper;
- (iii) the dielectric material comprises a polymer, and
- (iv) the dielectric material comprises ceramic or glass reinforcements.

20. The multilayer electronic support structure of claim 18, further characterized by at least one of:
- (i) the dielectric layer comprises a polymer selected from the group comprising polyimide, epoxy, Bismaleimide, Triazine and blends thereof;
- (ii) the dielectric layer comprises glass fibers, and
- (iv) the dielectric layer comprises particle fillers.

21. The multilayer electronic support structure of claim 1, wherein the at least one via layer is fabricated by a process comprising the steps of:
- (i) obtaining a substrate including a first feature layer and having exposed copper;
- (ii) covering the first feature layer with a seed layer;
- (iii) depositing a metal layer over the seed layer;
- (iv) depositing a layer of photo-resist over the seed layer;
- (v) exposing a positive pattern of vias in the photoresist;
- (vi) etching away the metal layer exposed;
- (vii) stripping away the photo-resist, leave the at least one component in the via layer upstanding, and
- (viii) laminating a dielectric material over the at least one component in the via layer.

22. The multilayer electronic support structure of claim 21, comprising the further step: (ix) thinning the dielectric material to expose the metal.

23. The multilayer electronic support structure of claim 22, comprising the further step: (x) depositing a second metal seed layer over the ground surface.

24. The multilayer electronic support structure of claim 22, wherein at least one of the following limitations applies:
- (a) the seed layer comprises copper;
- (b) the metal layer comprises copper;
- (c) the dielectric material comprises a polymer, and
- (d) the dielectric material further comprises ceramic or glass reinforcements.

25. The multilayer electronic support structure of claim 22, wherein at least one of the following limitations applies:
- (e) the dielectric material comprises a polymer selected from the group comprising polyimide, epoxy, Bismaleimide, Triazine and blends thereof;
- (f) the dielectric material comprises a polymer reinforced with glass fibers, and
- (g) the dielectric material comprises a polymer and inorganic particle fillers.

* * * * *